United States Patent [19]

Mansuria et al.

[11] 4,263,965
[45] Apr. 28, 1981

[54] LEAVED THERMAL COOLING MODULE

[75] Inventors: Mohanlal S. Mansuria, Wappingers Falls; Carl D. Ostergren, Montgomery, both of N.Y.

[73] Assignee: International Business Machines Corporation, Armonk, N.Y.

[21] Appl. No.: 113,898

[22] Filed: Jan. 21, 1980

[51] Int. Cl.³ .................. H01L 23/36; H01L 23/44
[52] U.S. Cl. ............................. 165/80 C; 165/185; 357/82; 361/386
[58] Field of Search ............... 165/80 B, 80 C, 185; 174/16 HS; 357/81, 82; 361/386

[56] References Cited

U.S. PATENT DOCUMENTS

| | | | |
|---|---|---|---|
| 3,212,564 | 10/1965 | Passman et al. | 165/185 |
| 3,449,172 | 6/1969 | Dingwall | 165/185 |
| 3,551,758 | 12/1970 | Ferree | 165/80 C |
| 3,741,292 | 6/1973 | Aakalu et al. | 165/80 C |
| 3,993,123 | 11/1976 | Chu et al. | 165/80 C |
| 4,138,692 | 2/1979 | Meeker et al. | 357/82 |
| 4,156,458 | 5/1979 | Chu et al. | 165/185 X |

OTHER PUBLICATIONS

Conduction Cooling, Chu, IBM Tech. Disclosure Bull., vol. 21, No. 2, Jul. 1978, pp. 752–753.
Serrated Pistons for Improved Module Cooling, Oktay et al., IBM Tech. Disclosure Bull., vol. 21, No. 5, Oct. 1978, pp. 1858–1859.
Brush-tipped Piston for Thermal Conduction, Dessauer et al., IBM Tech. Disclosure Bull., vol. 21, No. 5, Oct. 1978, p. 1857, Search Files.
Module Thermal Cap for Semiconductor Chip Package, Meeker et al., IBM Tech. Disclosure Bull., vol. 20, No. 7, Dec. 1977, pp. 2699–2700, search files.

Primary Examiner—Sheldon J. Richter
Attorney, Agent, or Firm—Wesley DeBruin

[57] ABSTRACT

A gas encapsulated cooling module wherein at least one semiconductor chip to be cooled is supported on a substrate portion of the module. The provision of thin leaf shaped members each having a relatively long thin planar surface in thermal contact with a planar surface of the chip to be cooled, said thin leaf shaped members each being contained within a module cover, each of said thin leaf shaped members being spring biased in thermal contact with said planar surface of said chip, whereby the relatively long thin planar surface of each thin leaf shaped member is maintained in intimate thermal contact with the planar surface of the chip.

2 Claims, 3 Drawing Figures

LEAVED THERMAL COOLING MODULE

BACKGROUND OF THE INVENTION AND PRIOR ART

The invention relates to an improved structure and technique for dissipating the heat generated by integrated circuit semiconductor chips.

With the advance of solid state electronics, various improved means of dissipating the heat generated by the solid state components have been investigated. The standard forced air convection means appears to have reached its limits of practicality in that the amount of air that is required to provide sufficient cooling for the limited heat dissipating surfaces introduces a noise problem, and without some auxiliary techniques cannot maintain each of a large number of components, such as integrated circuit semiconductor chips, within their proper operating temperature range. Accordingly, especially in connection with high speed data processing systems and the like, combinations of air-liquid cooling systems have been divised. One such system is an immersion cooling system, wherein the array of components to be cooled is immersed in a tank of cooling liquid. The liquids frequently employed are the fluorocarbon liquids which have a low-boiling point. These liquids are dielectric and give rise to various types of boiling at relatively low temperature. In view of the problems encountered in servicing and packaging components which are cooled using the immersion technique, an encapsulated cooling technique was provided which includes the same dielectric material encapsulated separately for each module.

U.S. Pat. No. 3,741,292 issued June 26, 1973 shows an example of a module having the heat generating components located thereon surrounded by a low boiling point dielectric liquid which is encapsulated thereto. A vapor space is located above the liquid level, which is filled with internal fins extending into the container serving as a condenser for the dielectric liquid vapors. External fins extend outward from the container and serve as an air cooled sink for the internal fins condenser. However, this type of a modular liquid encapsulated cooling device must meet certain inflexible requirements. For instance, it requires coolant of extremely high purity and free of any contaminants. Its operation is sensitive to all the variables which govern the basic process of nucleate boiling and vapor condensation. Furthermore, the concept is not readily adaptable to small scale applications such as a single heat generating component or semiconductor chip.

Reference is made to U.S. Pat. No. 3,993,123 entitled "Gas Encapsulated Cooling Module" granted Nov. 23, 1976 to Richard C. Chu et al. In the Chu et al patent a gas encapsulated cooling unit is provided for one or more heat generating devices (such as semiconductor chips) to be cooled. The components are mounted on a substrate. A cap is sealed to the substrate enclosing the heat generating devices to be cooled. An inert gas and good thermal conductive elements are contained within the sealed volume between the cap and the substrate. Each of the heat conductive elements are urged against respective ones of the heat generating devices forming a small gas gap (interface) to provide low thermal resistance. A heat sink associated with the cap receives the heat from the heat conductive elements through an annular gap which likewise contains inert gas.

Reference is made to U.S. Pat. No. 4,138,692 entitled "Gas Encapsulated Cooling Module" granted Feb. 6, 1979 to Robert G. Meeker et al. The Meeker et al patent discloses a gas encapsulated cooling module wherein at least one semiconductor chip to be cooled is supported on a substrate portion of the module. The Meeker et al patent discloses provision of a heat sink stud having a planar surface in thermal contact with a planar surface of the chip to be cooled, said stud being supported by a resilient thermally conductive bellow-like structure, whereby the planar surface of the stud is maintained in intimate thermal contact with the planar surface of the chip.

Reference is made to U.S. Pat. No. 4,156,458 entitled "Flexible Thermal Connector For Enhancing Conduction Cooling" granted May 29, 1979 to R. C. Chu et al. The R. C. Chu et al patent discloses a flexible thermal connector which consists of a heat conductive metallic foil bundle of sufficient thickness to contact sufficient surface area of the heat source to provide the required heat transfer and of sufficient thinness to be flexible enough to absorb the expansion and contraction due to temperature changes as well as the differences in distance between the heat source and sink and of sufficient length to contact at or near the other end thereof the heat sink.

Reference is made to the IBM Technical Disclosure Bulletin publication entitled "Conduction Cooling" by R. C. Chu, Vol. 21, No. 2, July 1978, pages 752-3. In the Chu publication a plurality of pin-pistons provide a number of contact points between the heat sink and the semiconductor chip.

Reference is made to the IBM Technical Disclosure Bulletin publication entitled "Serrated Pistons For Improved Module Cooling" by S. Oktay et al., Vol. 21, No. 5, October 1978, pages 1858-9. In the Oktay et al publication, the module uses pistons in removing heat by conduction from semiconductor chips. Truncated pyramidal shapes at the piston end improve contact to the chip. The piston has a cross-sectional geometry of a spline, modified spline, pinion gear or similar cross-section. The geometry provides a substantial increase in surface area at the annulus of the piston-to-module housing, thereby reducing the overall thermal resistance.

Reference is made to the IBM Technical Disclosure Bulletin publication entitled "Brush-Tipped Piston for Thermal Conduction" by R. G. Dessauer et al., Vol. 21, No. 5, October 1978, page 1857. The Dessauer et al publication discloses thermal conduction from a semiconductor chip on a substrate to a piston contained in a module cap. A number of wires extend from the piston and contact the planar surface of the semiconductor chip. The wires are deformed by spring loading the piston.

SUMMARY OF THE INVENTION

Apparatus is provided which makes a good heat transfer connection between a semiconductor chip and a heat sink. The apparatus accommodates variations in path length, or distance between different semiconductor chips and the heat sink as well as variations in path length from various points on the planar surface of a given semiconductor chip to the heat sink. The apparatus includes a plurality of thin leaf shaped members having an elongated thin planar surface in thermal contact with a planar surface of the chip to be cooled. There is a plurality, for example, three, leaf shaped members associated with each chip in the gas encapsulated module. Each thin leaf shaped member is contained in a relatively deep slot within a module cover. Each leaf shaped member is spring biased in thermal contact with said planar surface of the chip with which it is associated. Thus, in the illustrative and preferred embodiment set-forth in detail hereinafter, there are a plurality of chips and each of said chips has a thermal path comprised of three thin leaf shaped members.

A heat transfer connection between a heat source and a heat sink comprising: (a) a plurality of leaf members; (b) each leaf member incorporating extensions that may be placed under compression; (c) a slotted cover; (d) each leaf member disposed in a slot of the cover; and (e) means for disposing the slotted cover and leaf members between the heat source and the heat sink whereby each leaf member is placed under compression and together with the cover completes a thermal connection between the heat source and the heat sink.

The primary object of the present invention is to provide an improved thermal path between a semiconductor chip and a heat sink and which accommodates differences in height and skew or tilt of semiconductor chips with respect to the heat sink. The apparatus of the present invention also absorbs expansion and contraction without exceeding the acceptable level of force on the semiconductor chip. The leaves provide low and distributed loads on the chip.

It is another object of the invention to provide an improved thermal path between a semiconductor chip and a heat sink which consists essentially of a plurality of thin leaf shaped members, each having one end in thermal contact with a planar surface of the chip and other end spring-biased within a slot of a cover member.

It is another object of the invention to provide an improved thermal path between a semiconductor chip and a heat sink by utilizing thin leaf shaped members to accommodate the incline or tilt of a semiconductor chip with respect to the heat sink.

DESCRIPTION OF THE PREFERRED EMBODIMENT

Figure 1:
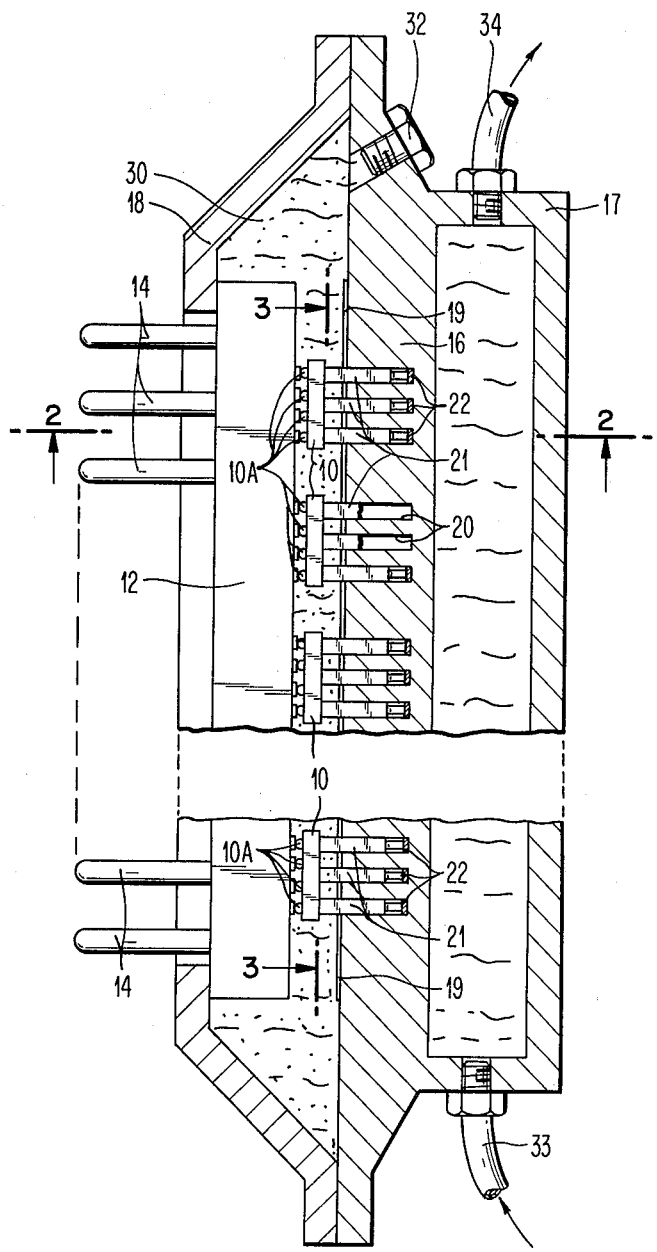
FIG. 1 is a cross-sectional view of a portion of a gas encapsulated module showing the thin leaf shaped members spring biased between the semiconductor chips and the slotted module cover all in accordance with the invention.

Referring to FIG. 1, there is shown a cross-sectional view of a gas encapsulated module, in accordance with the invention, for providing cooling of the solid state electronic chips 10. As is well known, the chip consists of solid state circuits and devices which are densely packed on each chip. The power consumed in the circuits within the chip generate heat which must be removed from the chip. Since the various circuits have different power requirements, and since the integrated components thereon must be maintained within certain temperature ranges for reliable operation, the cooling must be of such character as to maintain the chip temperature within the required operation range.

The chips 10 are mounted on one side of a substrate 12, generally made of ceramic, which has pins 14 extending from the other side thereof. For purposes of this description, it is sufficient to merely appreciate that the integrated circuits on the chips are connected by known techniques via solder balls 10A to conductors (not shown) in the substrate. These conductors are, in turn, selectively connected to pins 14. These connecting pins 14 provide for the plugging of the module into a board (not shown) which may carry auxiliary circuits, etc. A module cap 16 is attached to the substrate 12 by means of a flange 18 which extends from the periphery of the substrate 12 to the cap 16. The cap 16 is formed of a good heat conductive material such as copper or aluminum. The cap 16 contains a number of elongated parallel slots 20. The slots 20 of cap 16 are divided into a plurality of recesses, or blind openings 20A by spacer wires 19. The recesses 20A in cap 16 are arranged in a pattern corresponding to the chip position on substrate 12. Each recess 20A in cap 16 is disposed opposite to and in alignment with a chip 10.

Figure 2:
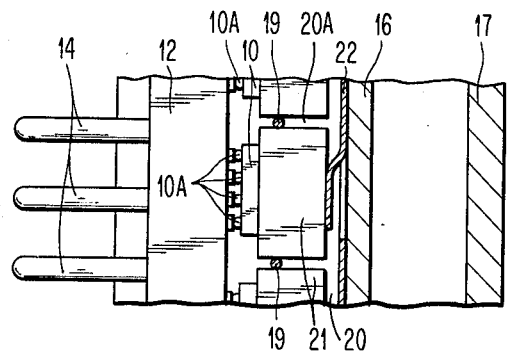
FIG. 2 is a cross-sectional view along the line 2—2 of FIG. 1 showing the side view or width of the thin leaf shaped members.
Figure 3:
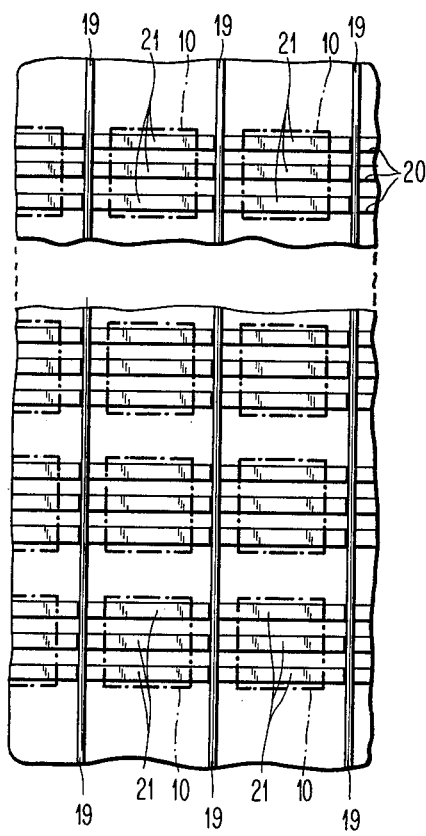
FIG. 3 is a cross-sectional view along the line 3—3 of FIG. 1 showing the slots in the module cover and the thin leaf shaped members residing in the slots between spacer wires.

As shown in FIG. 3, the recesses 20A are portions of a slot 20 delineated by spacer wires 19. Each recess 20A within the cap member 16 is accurately sized to receive a thermal conductive thin leaf shaped member 21. Each thin leaf shaped member is spring biased, spring 22, within a recess 20A of a slot 20. The spring 22, may be an integral part of the thin leaf member, or a separate spring pushing the thin leaf member against the chip planar surface. Each thin leaf shaped member is opposite and in alignment with a chip 10. Each thin leaf shaped member, as viewed in FIGS. 1 and 2, is in thermal communication with a chip and the thermal cap 16. Each thin leaf shaped member 21 has an elongated thin planar surface forming an interface with the opposing disposed planar surface of its associated chip. Each spring biased thin leaf shaped member 21 is sufficiently free to move within its recess 20A so as to attain relatively flat surface engagement with the planar surface of the oppositely disposed chip. Alternately thin leaf shaped members 21 are and may properly be termed thin rectangularly shaped members. It will also be appreciated that the spring biased thin leaf shape members are sufficiently free to move within its recess 20A to make good thermal contact with the planar surface of a chip that is inclined, or tilted, or high. The thermal resistance of the thin leaf shaped members/chip interface is reduced due to the high degree of intimate physical contact between the oppositely disposed elongated narrow planar surfaces of the thin leaf shaped members and the planar surface of the chip. The thermal resistance of the thin leaf members/cap interface is also reduced because the elongated thin leaf shaped members provide sufficiently large lateral surface area common to thin leaf members and the slots in the cap. A thermally conductive fluid 30, preferably helium is introduced into the open space or volume between the substrate 12 and cap 16 through fluid fill opening 32. It is to be appreciated that space or volume between substrate 12 and cap 16 is hermetically sealed so as to retain helium. The gas has a low molecular weight and thus readily permeates and fills the voids in the thin leaf shaped members/chip interface. Because of better planar contact between chip and the thin leaf shaped members and large lateral surface area of thin leaf shaped members in the slots, a low conductive media like inert nitrogen may be used for certain applications. Hence, the expensive sealing process may be eliminated or the hermeticity requirements relaxed.

Referring to FIG. 1 the space or volume between cover 17 and cap 16 has an inlet 33 and outlet 34 through which suitable cooling liquid such as water is caused to flow. The volume between cap 16 and cover 17, through which a liquid coolant is passed, may be termed a cold plate.

It will be appreciated that a number of modifications and changes in the preferred embodiment may be made without departing from the scope of the invention. For example, the use of the cold plate in certain applications. The number of chips on the substrate 12 and contained within the module may vary from one to a sizeable number such as 100. The number of thin leaf shaped members per chip may be greater than three or less than three. The preferred number of thin leaf shaped members per chip is three to five. In a module containing a plurality of chips, the number of thin leaf shaped members per chip may vary from chip to chip in accordance with the cooling requirements of the chip. The cross section area of the thin leaf shaped members may be enlarged at the member/chip interface portion of the thin leaf shaped member.

The combination of the high heat conductivity of helium and the ability of helium to fill gaps, together with the improved physical contact at the members/chip interface provided by the thin leaf shaped members, has been utilized in the preferred embodiment of the invention to provide a further improved thermal junction of chip/members interface and an improved cooling module.

While the invention has been particularly shown and described with reference to a preferred embodiment thereof, it will be understood by those skilled in the art that the foregoing and other changes in form and detail may be made without departing from the spirit of the invention.

We claim:

1. An improved heat transfer connection between a module cover and an integrated circuit semiconductor chip, said connection comprising:
   a plurality of spaced apart recesses in said cover, said recesses being spaced from and aligned with a planar surface of said semiconductor chip;
   a plurality of spaced apart thin rectangularly shaped members, each of said spaced apart thin rectangularly shaped members being partially contained within a discrete one of said recesses of said cover, each of said thin spaced apart rectangularly shaped members being under spring bias to maintain intimate physical contact with said planar surface of said chip and said module cover; and
   means for hermetically enclosing a volume encompassing said cover and said planar surface of said chip.

2. A cooling module for integrated circuit chips, said cooling module comprising:
   a multilayer ceramaic substrate having a first essentially planar surface and a second essentially planar surface, said multilayer ceramic substrate including an electrical circuit pattern contained therein and on at least one of said planar surfaces;
   a plurality of integrated circuit chips supported on said first planar surface of said substrate and electrically connected to said electrical circuit pattern of said multilayer ceramic substrate, each of said semiconductor chips having an exposed essentially planar surface;
   a plurality of electrically conductive connector pins extending from said second planar surface of said substrate, said plurality of electrically conductive pins being electrically connected to said electrical circuit pattern of said substrate;
   module cap means hermetically sealed to said substrate to provide a volume encompassing said plurality of chips, said module cap means having a plurality of spaced apart groups of spaced apart slots, each group of said spaced apart slots of said module cap means being oppositely disposed from and aligned with the exposed essentially planar surface of a discrete one of said plurality of integrated circuit chips;
   a plurality of thin rectangularly shaped members, each of said thin rectangularly shaped members being partially contained within a discrete one of said plurality of slots, each of said thin rectangularly shaped members being under spring bias to maintain intimate physical contact between the exposed essentially planar surface of a discrete one of said chips and said module cap means; and
   a cooling medium contained within said hermetically sealed volume formed by said substrate and said module cap means.

* * * * *

UNITED STATES PATENT AND TRADEMARK OFFICE
CERTIFICATE OF CORRECTION

PATENT NO. : 4,263,965
DATED : April 28, 1981
INVENTOR(S) : Mohanlal S. Mansuria and Carl D. Ostergren It is certified that error appears in the above-identified patent and that said Letters Patent are hereby corrected as shown below:

In the Patent ABSTRACT line 7, after "a" insert --discrete narrow, relatively deep slot within a--.

Signed and Sealed this

Seventh Day of July 1981

[SEAL]

Attest:

RENE D. TEGTMEYER

Attesting Officer

Acting Commissioner of Patents and Trademarks